(12) United States Patent
Umemoto et al.

(10) Patent No.: US 6,184,058 B1
(45) Date of Patent: *Feb. 6, 2001

(54) INTEGRATED THIN FILM SOLAR BATTERY AND METHOD FOR FABRICATING THE SAME

(75) Inventors: Akimasa Umemoto, Sakurai; Susumu Kidoguchi, Kitakatsuragi-gun, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/176,902

(22) Filed: Oct. 22, 1998

(30) Foreign Application Priority Data

Oct. 24, 1997 (JP) .................................................. 9-292897

(51) Int. Cl.⁷ .................................................. H01L 21/00
(52) U.S. Cl. .................................. 438/73; 438/80; 438/89
(58) Field of Search .................................. 438/73, 80, 89

(56) References Cited

FOREIGN PATENT DOCUMENTS

| | | | |
|---|---|---|---|
| 43 24 318 C1 | 1/1995 | (DE) | ............................... H01L/31/18 |
| 0 763 858 A2 | 3/1997 | (EP) | ........................... H01L/31/0224 |
| 60-100479 | 1/1985 | (JP) | ............................... H01L/31/04 |
| 60-100480 | 6/1985 | (JP) | ............................... H01L/31/04 |
| 60-117649 | 6/1985 | (JP) | . |
| 61-6828 | 1/1986 | (JP) | ............................ H01L/21/302 |
| 61-91971 | 5/1986 | (JP) | ............................... H01L/31/04 |
| 64-86557 | 3/1989 | (JP) | ............................... H01L/31/04 |
| 4-47466 B2 | 8/1992 | (JP) | . |
| 6-91269 B2 | 11/1994 | (JP) | . |
| 7-19913 B2 | 3/1995 | (JP) | . |
| 7-58351 | 3/1995 | (JP) | ............................... H01L/31/04 |
| 9-500236 | 1/1997 | (JP) | . |

*Primary Examiner*—Mark Chapman
(74) *Attorney, Agent, or Firm*—Nixon & Vanderhye P.C.

(57) ABSTRACT

The integrated thin film solar battery of this invention includes a plurality of unit cells serially connected with one another on a same translucent insulating substrate, each of the unit cells including a transparent conductive film electrode, a photoelectric conversion layer, and a back electrode formed in this order so that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer using a laser beam, and a wavelength of the laser beam exceeding 0.60 $\mu$m is used for the scribing so that side edges of the contact line of the photoelectric conversion layer is heated to be crystallized and thus made conductive and that the crystallized side edges can provide a conduction effect added to a contact effect of a groove of the contact line.

4 Claims, 2 Drawing Sheets

INTEGRATED THIN FILM SOLAR BATTERY AND METHOD FOR FABRICATING THE SAME

BACKGROUND OF THE INVENTION

1. Field of the Invention

The present invention relates to an integrated thin film solar battery including a plurality of unit cells serially connected with one another on a same translucent insulating substrate and a method for fabricating the same. More particularly, the present invention relates to an integrated thin film solar battery where a transparent conductive film electrode of one unit cell is connected to a back electrode of an adjacent unit cell via a contact line, and a method for fabricating the same.

2. Description of the Related Art

As one of conventional thin film solar batteries, a solar battery cell including a transparent conductive film electrode made of $SnO_2$, ZnO, or ITO, a photoelectric conversion layer, and a back reflection metal film electrode formed in this order on a translucent insulating substrate is known. Glass or a heat resistant resin such as polyimide is used as the translucent insulating substrate.

An integrated thin film solar battery is composed of such thin film solar battery cells serially connected with one another on a large-area substrate, to obtain a thin film solar battery cell unit with high voltage and high output.

Such an integrated thin film solar battery is fabricated in the following manner. First, a transparent conductive film is formed on a translucent insulating substrate. The transparent conductive film is then patterned by forming insulating patterning lines which divide the transparent conductive film into a plurality of strip-shaped transparent conductive film electrodes.

A photoelectric conversion layer is then formed on the transparent conductive film electrodes and patterned by forming patterning lines at positions displaced from the insulating patterning lines of the transparent conductive film so that only the photoelectric conversion layer can be partially removed to form grooves without damaging the underlying transparent conductive film electrodes. Subsequently, a back reflection metal film is formed on the resultant substrate, and patterned by forming patterning lines at positions opposing to the insulating patterning lines of the transparent conductive film with the patterning lines of the photoelectric conversion layer interposed therebetween so that only the back reflection metal film can be divided in an insulating manner, to form back reflection metal film electrodes. In this way, the integrated thin film solar battery is obtained.

With the technique described above, the transparent conductive film electrode of one thin film solar battery unit cell can be serially connected to the back reflection metal film electrode of an adjacent thin film solar battery unit cell. In this way, a number of unit cells are serially connected with one another, realizing the integrated thin film solar battery formed on a large-area substrate.

The insulating patterning of the transparent conductive film, as well as the patterning of the photoelectric conversion layer for forming grooves for contact lines, are conventionally performed by a scribing technique using a laser beam. This technique is considered optimal among currently available techniques for the following reasons: It is advantageous in the processing precision and the tact time (a time required to process one large-area substrate); and it allows for selective film processing utilizing the selective absorption of laser light based on a wavelength of the laser light by an object to be processed.

A conventional technique for forming the patterning lines for the photoelectric conversion layer is disclosed in Japanese Publication for Opposition No. 4-47466. According to this technique, the photoelectric conversion layer is irradiated with a laser beam having a wavelength of 0.60 μm or less, to partially abrade the irradiated portions, forming grooves.

According to the above technique, the photoelectric conversion layer can be processed without damaging the underlying transparent conductive film electrodes because the laser beam passes through the transparent conductive film electrodes. Examples of the laser beam having a wavelength of 0.60 μm or less used conventionally include second harmonic (SHG, 0.532 μm) of an Nd-YAG laser beam, an XeCl excimer laser beam (0.308 μm), and an Ar laser beam (0.51 μm). Recently, second harmonic (SHG, 0.532 μm) of an Nd-YAG laser beam tends to be used since it is easy to maintain, does not use corrosive high-pressure gas, and is inexpensive to operate.

A problem arises in the mass-production of such a large-area integrated thin film solar battery. That is, the tact time increases in the patterning of the photoelectric conversion layer.

More specifically, in the patterning of the large-area integrated thin film solar battery, the patterning pitch, i.e., the width of each thin film solar battery unit cell is generally in the range of 5 to 15 mm, although it depends on the sheet resistance of the transparent conductive film electrodes, the contact resistance between the photoelectric conversion layer and the back reflection metal film electrodes, and the shape of the photoelectric conversion layer.

Accordingly, when the length of the translucent insulating substrate in the direction perpendicular to the patterning lines is 450 mm, for example, and the patterning pitch is 10 mm, 45 patterning lines are formed. The number of patterning lines is greater as the size of the substrate becomes greater, increasing the tact time required to process one large-area substrate.

The above problem can be overcome by splitting the laser beam into a plurality of laser beams by use of a beam splitter, to allow several laser beams to be used simultaneously and thus suppress the increase in the tact time.

However, the energy amount required to abrade the photoelectric conversion layer does not change even though a split laser beam is used. Therefore, the original laser beam before the splitting is required to have the energy equal to the energy required for one split laser beam multiplied by the number of split laser beams.

The second harmonic (SHG, 0.532 μm) of the Nd-YAG laser beam is generated by transmitting a fundamental wave (1.064 μm) of the Nd-YAG laser beam through nonlinear optical crystal (e.g., BBO crystal). At this time, the energy of the resultant SHG beam is reduced to about one-tenth of that of the original fundamental wave. Accordingly, the number of split laser beams obtained from this laser beam is limited.

In consideration of the above, a structure of a large-area integrated thin film solar battery, as well as a method for fabricating such a solar battery, capable of shortening the tact time and thus realizing improved production efficiency and cost reduction are earnestly required.

SUMMARY OF THE INVENTION

The integrated thin film solar battery of this invention includes a plurality of unit cells serially connected with one another on a same translucent insulating substrate, each of the unit cells including a transparent conductive film electrode, a photoelectric conversion layer, and a back electrode formed in this order so that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer using a laser beam, and a wavelength of the laser beam exceeding 0.60 µm is used for the scribing so that side edges of the contact line of the photoelectric conversion layer is heated to be crystallized and thus made conductive and that the crystallized side edges can provide a conduction effect added to a contact effect of a groove of the contact line.

In one embodiment of the invention, the contact line includes: a portion where a conduction is secured by a direct contact between the transparent conductive film electrode and the back electrode; and a portion where a conduction is secured by the crystallization of the photoelectric conversion layer.

In another embodiment of the invention, the portion of the contact line where a conduction is secured by the crystallization of the photoelectric conversion layer is in contact with an insulating patterning line for the transparent conductive film electrode.

According to another aspect of the invention, a method for fabricating an integrated thin film solar battery is provided. The integrated thin film solar battery includes a plurality of unit cells serially connected with one another on a same translucent insulating substrate, each of the unit cells including a transparent conductive film electrode, a photoelectric conversion layer, and a back electrode formed in this order so that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer with a laser beam, and a wavelength of the laser beam exceeding 0.60 µm is used for the scribing so that side edges of the contact line of the photoelectric conversion layer is heated to be crystallized and thus made conductive and that the crystallized side edges can provide a conduction effect added to a contact effect of a groove of the contact line. The method includes the step of: forming the contact line by scribing the photoelectric conversion layer using second harmonic (0.661 µm) of a Q-switch drive Nd-YLF laser beam (1.321 µm) as the laser beam.

In an alternative method for fabricating an integrated thin film solar battery of the present invention, the integrated thin film solar battery includes a plurality of unit cells serially connected with one another on a same translucent insulating substrate, each of the unit cells including a transparent conductive film electrode, a photoelectric conversion layer, and a back electrode formed in this order so that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer with a laser beam, and a wavelength of the laser beam exceeding 0.60 µm is used for the scribing so that side edges of the contact line of the photoelectric conversion layer is heated to be crystallized and thus made conductive and that the crystallized side edges can provide a conduction effect added to a contact effect of a groove of the contact line. The method includes the step of: forming the contact line by scribing the photoelectric conversion layer using second harmonic (0.660 µm) of a Q-switch drive Nd-YAG laser beam (1.319 µm) as the laser beam.

In one embodiment of the invention, the laser beam is changed to a beam having a uniform in-plane energy density by use of a converging optical system.

Thus, according to the present invention, a laser beam having a wavelength exceeding 0.60 µm is used for scribing. Such a laser beam having a wavelength exceeding 0.60 µm provides a large local heating effect during the laser abrasion, heating portions surrounding the process spot irradiated with the laser beam.

As a result, the heated portions, i.e., the side edges of the patterning lines of the photoelectric conversion layer are crystallized and thus made conductive. These crystallized conductive portions provide a contact effect in addition to the grooves of the patterning lines.

Accordingly, even if the photoelectric conversion layer is patterned to have a narrow width using a laser beam having a wavelength exceeding 0.60 µm, substantially the same effect as that obtained by being patterned with a wide width using a laser beam having a wavelength of 0.60 µm or less which is less effective in crystallizing the side edges of the patterning lines.

The fact that the patterning width can be smaller means that a laser beam with the same in-plane energy density can be split into a larger number of laser beams. Thus, according to the present invention, using a larger number of laser beams, the tact time required for processing the substrate of the large-area integrated thin film solar battery can be shortened.

Each contact line can be composed of two conductive portions; a portion where the conduction is secured by the direct contact between the transparent conductive film electrode and the back electrode and a portion where the conduction is secured by the crystallization of the photoelectric conversion layer, i.e., the side edges of the patterning line. With this configuration, the contact resistance of the patterning line is made smaller than that obtained when only the groove of the patterning line is used.

The reduction of the contact resistance of the patterning line reduces the series resistance of the large-area integrated thin film solar battery. As a result, an integrated thin film solar battery with a high conversion efficiency can be obtained.

The portion of the contact line made of the crystallized conductive side edges can be arranged in contact with the insulating patterning line of the transparent conductive film. With this configuration, the portion of the photoelectric conversion layer which is an amorphous semiconductor located between the patterning line (first scribed line) of the transparent conductive film and the patterning line (contact line; second scribed line) of the photoelectric conversion layer can also be utilized as the contact line since the portion is crystallized and thus made conductive.

AS a result, by arranging the patterning line of the transparent conductive film and the patterning line of the amorphous semiconductor photoelectric conversion layer close to each other, substantially the same effect as that obtained by arranging the two patterning lines in contact with each other is obtained. The effect obtained by arranging the two patterning lines in contact with each other means that the area loss by the existence of a non-power generating portion due to the integration can be reduced.

Extremely high precision will be required to arrange the two types of patterning lines in contact with each other without the help of the conduction effect obtained by crystallizing the side edges of one of the patterning lines. According to the present invention, however, a sufficient margin can be secured for the processing precision.

A method for fabricating an integrated thin film solar battery according to the present invention includes the step of forming contact lines by scribing the photoelectric conversion layer by use of second harmonic (0.661 μm) of an Nd-YLF laser beam (1.321 μm). The Q-switch drive Nd-YLF laser is easy to maintain, does not use a corrosive high-pressure gas, and is inexpensive to operate. This contributes to the reduction of the production cost of the integrated thin film solar battery.

Second harmonic (0.660 μm) of a Q-switch drive Nd-YAG laser beam (1.319 μm) may also be used. In this case, also, the Q-switch drive Nd-YAG laser is easy to maintain, does not use a corrosive high-pressure gas, and is inexpensive to operate. This contributes to the reduction of the production cost of the integrated thin film solar battery.

According to another method for fabricating an integrated thin film solar battery according to the present invention, the second harmonic (0.661 μm) of the Q-switch drive Nd-YLF solid laser beam (1.321 μm) and the second harmonic (0.660 μm) of the Q-switch drive Nd-YAG solid laser beam (1.319 μm) are changed to energy beams with a uniform in-plane energy density using a converging optical system. With this method, the grooves of the contact lines are formed as straight scribed line grooves by sequentially radiating a rectangular one-shot laser beam. Accordingly, uniform and stable contact lines with crystallized side lines are formed.

The material of the transparent conductive electrodes, such as $SnO_2$, ZnO, and ITO, sufficiently transmits light in the range of visible light wavelengths of 0.60 μm or more. Accordingly, the transparent conductive electrodes are not damaged during the process of the amorphous semiconductor photoelectric conversion layer made of a-Si:H.

Thus, the invention described herein makes possible the advantages of (1) providing an integrated thin film solar battery capable of shortening the tact time and thus realizing improved production efficiency and cost reduction and a method for fabricating the same; (2) providing an integrated thin film solar battery capable of obtaining a lower contact resistance of patterning lines compared with the case of using only grooves of the patterning lines and thus reducing the series resistance of the large-area integrated thin film solar battery and improving the conversion efficiency; (3) providing an integrated thin film solar battery capable of reducing the area loss by the existence of portions which do not contribute to power generation caused by the integration of solar battery cells and allowing for a sufficient margin of processing precision; and (4) providing a method for fabricating an integrated thin film solar battery where grooves of contact lines are formed as straight scribed line grooves by sequentially emitting a rectangular one-shot laser beam so as to form uniform and stable contact lines with crystallized side lines.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of example with reference to the accompanying drawings.

EXAMPLE 1

Figure 1:
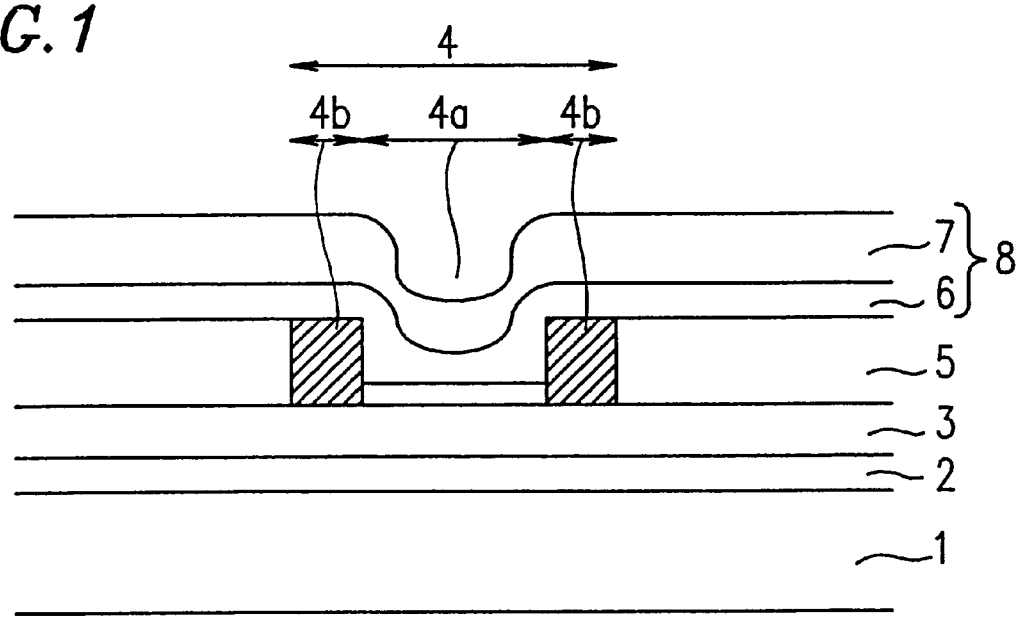
FIG. 1 is a sectional view illustrating a patterning line in Example 1 according to the present invention.

An integrated thin film solar battery of Example 1 according to the present invention will be described with reference to FIGS. 1 to 3.

First, the structure and fabrication process of the integrated thin film solar battery of this example will be described with reference to FIGS. 1 and 2. FIG. 1 is a sectional view of a contact line formed for the integrated thin film solar battery. FIG. 2 illustrates a device for measuring the resistance of contact lines by a telemetering (TLM) method (a contact line resistance measuring device) according to the present invention.

A glass substrate with a thickness of 1.1 mm and a refractive index of 1.5 is used as a translucent insulating substrate 1. An $SiO_2$ layer 2 with a refractive index of 1.5 is deposited on one surface of the translucent insulating substrate 1 to a thickness of 100 nm by a normal pressure chemical vapor deposition (CVD) method. This deposition is performed at a substrate temperature of 500° C.

Then, $SnO_2$ is deposited on the $SiO_2$ layer 2 by the normal pressure CVD method to form a transparent conductive film 3 with a thickness of 1 μm having a texture structure with a Hayze index of 12% to 15%. This deposition is performed at a substrate temperature of 500° C. by supplying $SnCl_2$ as a material gas at 25 l/min., HF as a doping gas at 1 l/min., and $H_2O$ for oxidation at 0.2 l/min. The sheet resistance of the transparent conductive film 3 is 10 Ω/□. The transparent conductive film 3 is then patterned by scribing (first scribing process) in the same manner as that described above in the prior art case, to form transparent conductive film electrodes.

Thereafter, a photoelectric conversion layer 5 made of an amorphous semiconductor having a three-layer structure composed of a p layer, an i layer, and an n layer is formed on the transparent conductive film electrodes 3. More specifically, the translucent insulating substrate 1 is placed in a plasma CVD apparatus (not shown) and heated to 200° C. Then, monosilane gas, methane gas, and hydrogen gas are supplied as reaction gases at flow rates of 30 sccm, 89 sccm, and 150 sccm, respectively, and a 1% hydrogen diluted diborane gas is supplied as a doping gas at a flow rate of 10 sccm, so as to form the p layer with a thickness of 12 nm.

While keeping the substrate temperature at 200° C., monosilane gas and hydrogen gas are supplied as reaction gases at flow rates of 60 sccm and 20 sccm, respectively, so as to form the i layer with a thickness of 400 nm. Likewise, while keeping the substrate temperature at 200° C., monosilane gas is supplied as a reaction gas at a flow rate of 18 sccm, so as to form the n layer with a thickness of 100 nm. Thus, the amorphous semiconductor photoelectric conversion layer 5 made of a-Si:H is formed.

Subsequently, the amorphous semiconductor photoelectric conversion layer 5 is patterned by scribing (second scribing process) using a laser beam to form contact lines 4 for defining unit cells separated from one another.

As the laser beam used for the second scribing process in Example 1, second harmonic (0.660 μm) of a Q-switch oscillated Nd-YLF laser beam (1.319 μm) is used. This laser beam is irradiated onto the surface of the translucent insulating substrate 1 opposite to the surface thereof on which the transparent electrode film electrodes 3 and the amorphous semiconductor photoelectric conversion layer 5 are formed, under the conditions of the repeat frequency of 3 to 10 kHz, the scanning speed of 150 to 400 mm/sec., and the output at a surface being processed of 100 W/mm$^2$, so as to obtain scribed grooves with a width of 50 μm. Such scribed grooves constitute groove contact lines 4a of patterning lines.

Figure 2:
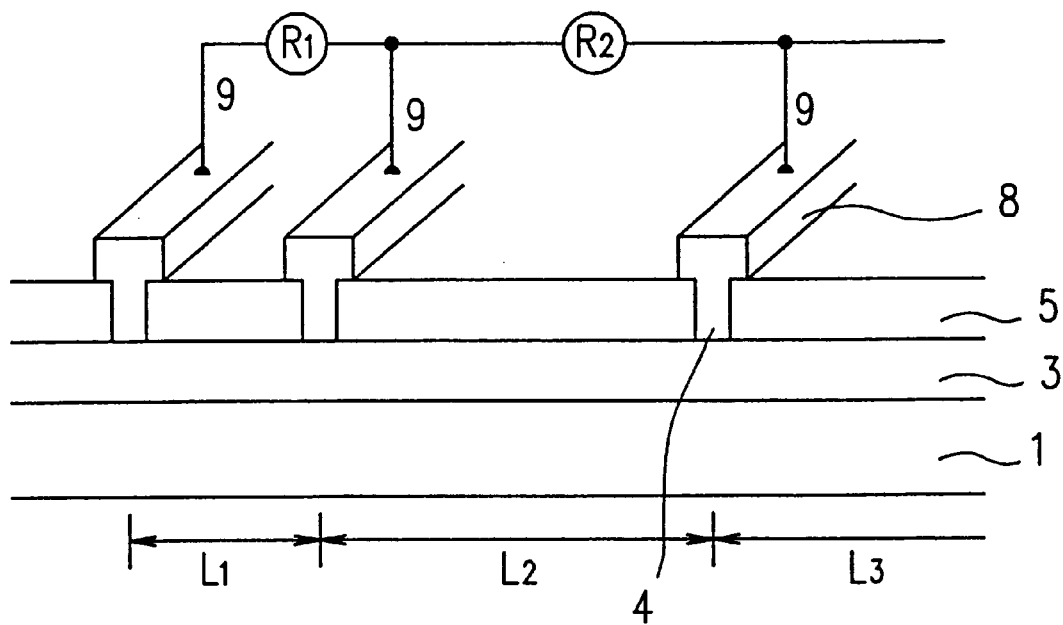
FIG. 2 is a perspective view of a telemetering (TLM) contact line resistance measuring device used in Example 1 according to the present invention.
Figure 3:
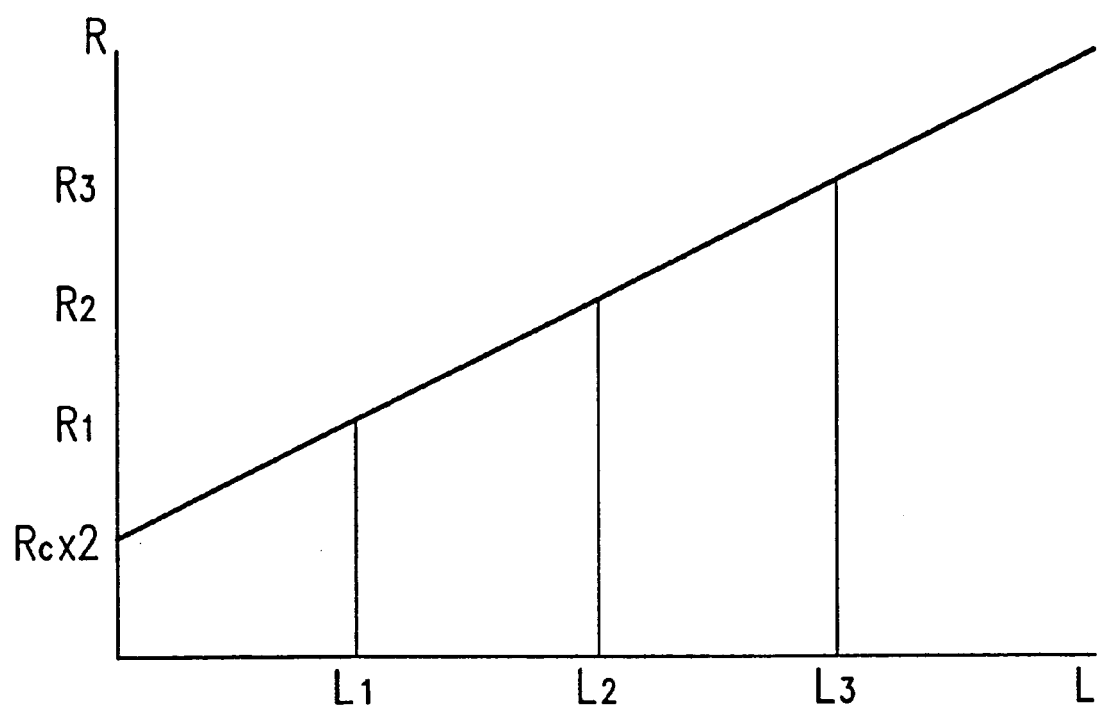
FIG. 3 is a graph showing the relationship between the distance between contact lines and the interline resistance measured by a TLM method used in Example 1 according to the present invention.

For the contact line resistance measuring device, the scribed grooves are patterned with arbitrary different distances $L_1$, $L_2$, $L_3$, . . . therebetween, as shown in FIG. 2.

As described above, when the scribing is performed using a laser beam having a wavelength exceeding 0.60 μm, the side edges of the patterning lines of the amorphous semiconductor photoelectric conversion layer 5 are heated and thus crystallized. This forms crystallized side contact lines 4b. The laser beam used in this scribing process is preferably changed to a beam having a uniform in-plane energy density by use of a converging optical system (not shown) as described above.

Thereafter, ZnO is deposited on the patterned amorphous semiconductor photoelectric conversion layer 5 to a thickness of 50 nm by sputtering, to form a back transparent conductive film 6. Ag is then deposited on the back transparent conductive film 6 to a thickness of 500 nm by sputtering, to form a back reflection metal film 7. The back transparent conductive film 6 and the back reflection metal film 7 constitute a back reflection electrode layer 8.

Although the back transparent conductive film 6 and the back reflection metal film 7 are deposited by sputtering in this example, the present invention is not limited to this deposition method. For example, the films 6 and 7 may be deposited by evaporation. Alternatively, one film 6 (or 7) may be deposited by sputtering while the other film 7 (or 6) may be deposited by evaporation.

The back reflection electrode layer 8 is then patterned to form a plurality of back reflection electrodes. The patterning lines of the back reflection electrode layer 8 are formed to correspond to the spaces between the groove contact lines 4a of the patterning lines of the amorphous semiconductor photoelectric conversion layer 5 (see FIG. 2).

The contact line resistance measuring device as shown in FIG. 2 is fabricated in the manner described above.

Hereinbelow, a method for measuring the resistance of the groove contact lines 4a of the patterning lines using the contact line resistance measuring device according to the present invention will be described.

First, as shown in FIG. 2, probes 9 are placed on the surfaces of the back reflection electrodes 8. Resistances $R_1$, $R_2$, . . . are measured for the distances $L_1$, $L_2$, . . . between every two adjacent groove contact lines 4a of the patterning lines by use of a semiconductor analyzer (not shown). The measured resistances $R_1$, $R_2$, . . . are plotted as shown in FIG. 3. FIG. 3 is a graph showing the relationship between the distance L (X axis) and the resistance R (Y axis).

In the above measurement, an internal resistance of the semiconductor analyzer and a series resistance of the probes 9 were removed from the measured resistance values. In the measurement of the internal resistance by use of the semiconductor analyzer, it was confirmed that the ohmic contact was obtained. The resistances $R_1$, $R_2$, . . . between every two adjacent groove contact lines 4a of the patterning lines were plotted for the distances $L_1$, $L_2$, . . . between every two adjacent groove contact lines 4a of the patterning lines. A value $R_c$ (Ω·cm$^2$) obtained by dividing a Y section of the regression line of the plot by two represents a contact resistance of the groove contact line 4a with a groove width of 50 μm and a length of 10 cm of Example 1.

EXAMPLE 2

An integrated thin film solar battery and a contact line resistance measuring device of Example 2 according to the present invention are the same as those of Example 1 described above, except that the width of the scribed grooves is different. In this example, the width of the scribed grooves is reduced to 24 μm, while it is 50 μm in Example 1.

(Measurement results of Examples 1 and 2)

The measurement results of the integrated thin film solar batteries of Examples 1 and 2 are shown in Table 1 below in comparison with a Comparative Example.

TABLE 1

|  | Ex. 1 | Ex. 2 | Com. Ex. |
|---|---|---|---|
| Laser wavelength (μm) | 0.660 | 0.660 | 0.532 |
| Spot size on process surface for one-shot laser beam (μm□) | 50 | 24 | 50 |
| Output at (W/mm$^2$) process surface | 120 | 120 | 100 |
| (W) | 0.30 | 0.07 | 0.25 |
| Width of scribed groove (μm) | 50 | 24 | 50 |
| Width of crystallized side edge (μm) | 18 | 18 | 5 |
| Width of effective contact line (μm) | 86 | 60 | 60 |
| Resistance of contact line (Ω·cm$^2$) | 1.7 | 3.0 | 3.0 |

The Comparative Example has the same transparent conductive film electrodes and amorphous semiconductor photoelectric conversion layer as those in Examples 1 and 2. However, the wavelength of the laser beam used for the patterning of the amorphous semiconductor photoelectric conversion layer, i.e., the scribing process thereof, was different from that used in Examples 1 and 2.

More specifically, in the Comparative Example, second harmonic (0.532 μm) of a Q-switch drive Nd-YAG laser beam (1.064 μm) was used. The amorphous semiconductor photoelectric conversion layer was irradiated with this laser beam repeatedly under the conditions of the frequency of 5 kHz, the scanning speed of 200 mm/sec., and the output at a surface to be processed of 100 W/mm$^2$, so as to obtain scribed grooves with a width of 50 μm.

As is apparent from Table 1, comparing Example 1 and the Comparative Example, where the contact lines with the same groove width were formed using laser beams with different wavelengths, shows the resistance of the contact lines reduced to 1.7 Ω·cm$^2$ in Example 1 from 3 Ω·cm$^2$ in the Comparative Example. The reason for this reduction is that Example 1 is provided with the conduction effect obtained by the crystallization of the amorphous semiconductor photoelectric conversion layer 5 due to irradiation with the laser beam.

Comparing Example 2 and the Comparative Example, it is found that Example 2 can obtain the same effective contact lines as those of the Comparative Example, although the width of the scribed grooves in Example 2 is smaller than that of the Comparative Example. The reason is that Example 2 can utilize the conduction effect obtained by the crystallization of the amorphous semiconductor photoelectric conversion layer 5.

In other words, due to the conduction effect obtained by the crystallization of the amorphous semiconductor photoelectric conversion layer 5, the spot size on a surface to be processed for one shot of the laser beam can be reduced while keeping the effects obtained by the conventional devices. This means that the number of split laser beams can be increased and thus the tact time can be shortened.

EXAMPLE 3

In Examples 1 and 2 above, the second harmonic (0.660 μm) of the Q-switch oscillated Nd-YLF laser beam (1.319 μm) was used for the laser scribing patterning of the amorphous semiconductor photoelectric conversion layer 5 made of a-Si:H. In Example 3, second harmonic (0.660 μm) of an Nd-YAG laser beam (1.319 μm) is used as a laser beam for the scribing.

In this example, the same effects as those described in Examples 1 and 2 were obtained.

Thus, according to the present invention, a laser beam having a wavelength exceeding 0.60 μm is used for scribing. Such a laser beam having a wavelength exceeding 0.60 μm provides a large local heating effect during the laser abrasion, heating the portions around the process spot irradiated with the laser beam.

As a result, the heated portions, i.e., the side edges of the patterning lines of the photoelectric conversion layer are crystallized and thus made conductive. These crystallized conductive portions provide a contact effect in addition to the grooves of the patterning lines.

Accordingly, even if the photoelectric conversion layer is patterned with a narrow width using a laser beam having a wavelength exceeding 0.60 μm, substantially the same effect as that obtained by being patterned with a wide width using a laser beam having a wavelength of 0.60 μm or less which is less effective in crystallizing the side edges of the patterning lines.

The fact that the patterning width can be smaller means that a laser beam with the same plane energy density can be split into a larger number of laser beams. Thus, according to the present invention, using a larger number of laser beams, the tact time required for processing the substrate of the large-area integrated thin film solar battery can be shortened.

According to an integrated thin film solar battery of the present invention, each contact line is composed of two conductive portions; a portion where the conduction is secured by the direct contact between the transparent conductive film electrode and the back electrode and a portion where the conduction is secured by the crystallization of the photoelectric conversion layer, i.e., the side edges of the patterning line. With this configuration, the contact resistance value of the patterning line is made smaller than that obtained when only the groove of the patterning line is used.

The reduction of the contact resistance value of the patterning line reduces the series resistance value of the large-area integrated thin film solar battery. As a result, an integrated thin film solar battery with a high conversion efficiency can be obtained.

According to another integrated thin film solar battery of the present invention, the portion of the contact line made of the crystallized conductive side is arranged in contact with the insulating patterning line of the transparent conductive film. With this configuration, the portion of the photoelectric conversion layer which is an amorphous semiconductor located between the patterning line (first scribed line) of the transparent conductive film and the patterning line (contact line; second scribed line) of the photoelectric conversion layer can also be utilized as the contact line since the portion is also crystallized and thus made conductive.

As a result, by forming the patterning line of the transparent conductive film and the patterning line of the amorphous semiconductor photoelectric conversion layer close to each other, substantially the same effect as that obtained by arranging the two patterning lines in contact with each other is obtained. The effect obtained by arranging the two patterning lines in contact with each other means that the area loss by the existence of a non-power generating portion due to the integration can be reduced.

Extremely high precision will be required to form the two types of patterning lines to be in contact with each other without the help of the conduction effect obtained by crystallizing the side edges of the patterning line. According to the present invention, however, a sufficient margin can be secured for the processing precision.

A method for fabricating an integrated thin film solar battery of the present invention includes the step of forming contact lines by scribing the photoelectric conversion layer by use of second harmonic (0.661 μm) of an Nd-YLF laser beam (1.321 μm). The Q-switch drive Nd-YLF laser is easy to maintain, does not use a corrosive high-pressure gas, and is inexpensive to operate. This contributes to the reduction of the production cost of the integrated thin film solar battery.

Second harmonic (0.660 μm) of a Q-switch drive Nd-YAG laser beam (1.319 μm) may also be used. In this case, also, the Q-switch drive Nd-YAG laser is easy to maintain, does not use a corrosive high-pressure gas, and is inexpensive to operate. This contributes to the reduction of the production cost of the integrated thin film solar battery.

According to another method for fabricating an integrated thin film solar battery of the present invention, the second harmonic (0.661 μm) of the Q-switch drive Nd-YLF solid laser beam (1.321 μm) and the second harmonic (0.660 μm) of the Q-switch drive Nd-YAG solid laser beam (1.319 μm) are changed to energy beams with a uniform in-plane energy density using a converging optical system. With this method, the grooves of the contact lines are formed as straight scribed line grooves by sequentially radiating a rectangular one-shot laser beam. Accordingly, uniform and stable contact lines with crystallized side lines are formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating an integrated thin film solar battery, the integrated thin film solar battery comprising a plurality of unit cells serially connected with one another on a same translucent insulating substrate, the method comprising forming each of the unit cells to include a transparent conductive film electrode, a photoelectric conversion layer, and a back electrode in this order such that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer with a laser beam, and a wavelength of the laser beam exceeding 0.60 μm is used for the scribing so that side edges of the contact line of the photoelectric conversion layer is heated to be crystallized and thus made conductive and that the crystallized side edges can provide a conduction effect added to a contact effect of a groove of the contact line, the method further comprising:

forming the contact line by scribing the photoelectric conversion layer using second harmonic of a Q-switch drive Nd-YLF laser beam as the laser beam.

2. A method for fabricating an integrated thin film solar battery according to claim 1, wherein the laser beam is converted to a beam having a uniform in-plane energy density by use of a converging optical system, prior to scribing the photoelectric conversion layer.

3. A method for fabricating an integrated thin film solar battery, the integrated thin film solar battery comprising a plurality of unit cells serially connected with one another on a same translucent insulating substrate, the method comprising forming each of the unit cells to include a transparent conductive film electrode, a photoelectric conversion layer, and a back electrode in this order such that the transparent conductive film electrode of one unit cell is serially connected to the back electrode of an adjacent unit cell, wherein the transparent conductive film electrode of one unit cell and the back electrode of an adjacent unit cell are connected via a contact line, and the contact line is formed by patterning by scribing the photoelectric conversion layer with a laser beam, and a wavelength of the laser beam exceeding 0.60 μm is used for the scribing so that side edges of the contact line of the photoelectric conversion layer is heated to be crystallized and thus made conductive and that the crystallized side edges can provide a conduction effect added to a contact effect of a groove of the contact line, the method further comprising:

forming the contact line by scribing the photoelectric conversion layer using second harmonic of a Q-switch drive Nd-YAG laser beam as the laser beam.

4. A method for fabricating an integrated thin film solar battery according to claim 3, wherein the laser beam is converted to a beam having a uniform in-plane energy density by use of a converging optical system, prior to scribing the photoelectric conversion layer.

* * * * *